US006928494B1

(12) United States Patent
Volk et al.

(10) Patent No.: US 6,928,494 B1
(45) Date of Patent: Aug. 9, 2005

(54) METHOD AND APPARATUS FOR TIMING-DEPENDANT TRANSFERS USING FIFOS

(75) Inventors: Andrew M. Volk, Granite Bay, CA (US); Michael W. Williams, Citrus Heights, CA (US); David J. McDonnell, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/538,386

(22) Filed: Mar. 29, 2000

(51) Int. Cl.[7] .............................................. G06F 3/00
(52) U.S. Cl. .................... 710/52; 710/5; 710/6; 710/58; 711/167; 712/245
(58) Field of Search ................. 711/105, 106, 167–169; 710/52–61, 29, 5–6; 712/245–248

(56) References Cited

U.S. PATENT DOCUMENTS

| | | | | |
|---|---|---|---|---|
| 5,175,732 A | * | 12/1992 | Hendel et al. ............... | 370/463 |
| 5,758,131 A | * | 5/1998 | Taylor ......................... | 713/401 |
| 5,953,689 A | * | 9/1999 | Hale et al. ................... | 702/186 |
| 5,987,594 A | * | 11/1999 | Panwar et al. ............... | 712/216 |
| 6,092,129 A | * | 7/2000 | Smith et al. ................. | 704/224 |
| 6,192,446 B1 | * | 2/2001 | Mullarkey et al. ........... | 711/105 |
| 6,370,600 B1 | * | 4/2002 | Hughes et al. ................ | 710/29 |
| 6,385,708 B1 | * | 5/2002 | Stracovsky et al. .......... | 711/167 |
| 6,418,518 B1 | * | 7/2002 | Wen ............................ | 710/316 |

* cited by examiner

Primary Examiner—Jeffrey Gaffin
Assistant Examiner—Mike Nguyen
(74) Attorney, Agent, or Firm—John F. Travis

(57) ABSTRACT

A method and apparatus for communicating commands and/or data between two different time domains. In one embodiment, multiple memory commands are placed into one or more FIFOs in a manner that specifies the delays that must take place between execution of the different commands. Along with the commands, delay information is placed into the FIFOs, specifying the number of clock cycles, or other form of time delay, that must elapse between execution of a command and execution of a subsequent command. This delay information is used to delay the execution of the subsequent command for the specified time period, while minimizing or eliminating any excess delays. Cue information can also be placed into the FIFOs with the commands to specify which commands must wait for other commands before beginning execution. The delay and cue information is determined and created in the time domain that initiates the transfers. The delays and cueing are executed in the other time domain. Although the different commands may be delivered through different FIFOs and can therefore have unpredictable arrival times with respect to each other, the delay and cueing information maintains the proper execution order and timing between the commands. Interactive control logic at the output of each FIFO uses the timing data to maintain execution in the proper order and with the proper inter-command delays.

28 Claims, 4 Drawing Sheets

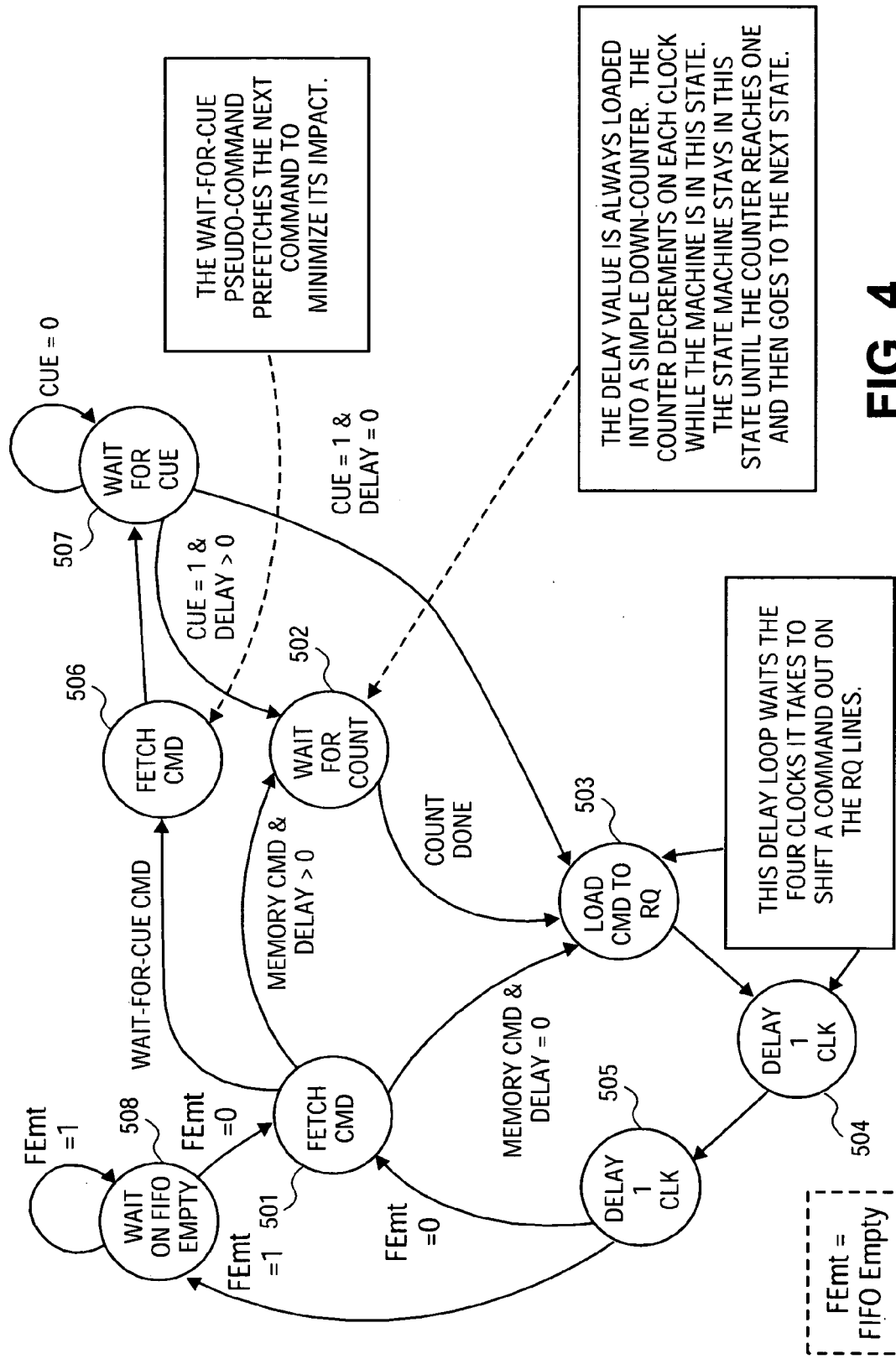

METHOD AND APPARATUS FOR TIMING-DEPENDANT TRANSFERS USING FIFOS

BACKGROUND OF THE INVENTION

1. Field of the Invention

The invention pertains generally to the field of data transfer in computer systems. More particularly, it pertains to transferring information between circuits that are operated in different digital clock domains.

2. Description of the Related Art

In modern computer systems, it is often necessary to transfer data between different circuits using different clocks, often referred to as circuits in different clock domains. In at least one prior art memory system, a memory clock is used to time the transfer of data and commands to one or more memory devices over a high-speed, packet-oriented memory bus. A host clock is used to manage memory access requests received from external agents and to format the requests into appropriate command and data packets for use on the memory bus. Transferring these command and data packets from the host domain to the memory domain requires making timing adjustments.

Since the two domains may operate at significantly different clock speeds, it may take a significantly different amount of time to transfer the commands/data out of one domain than it takes to transfer the commands/data into the other domain. This can cause inefficiencies in the transfer, since the faster circuitry must wait on the slower circuitry. Various techniques can be used to minimize the loss of efficiency, such as the use of first-in first-out (FIFO) buffers between the two domains. Data can be clocked into the FIFO using one clock, and clocked out of the FIFO using the other clock.

An additional problem is created when separate blocks of data with a pre-defined timing relationship are transferred over separate channels. For example, at least one prior art memory system transfers a row command sequence over one set of memory bus lines to open a block (the row) of memory, and then transfers a column command sequence over another set of memory bus lines to select a sub-block (the column) within that open block and initiate a data transfer. Once the block is opened, several different column commands can be sequentially issued to select and transfer different sub-blocks within the open block, without the need to issue another row command. For proper operation, the column command must not be issued until a pre-defined time period after the row command has been issued, and a subsequent column command must not be issued until a different pre-defined time period after the previous column command. In a similar manner, a new row command must not be placed on the bus until another pre-defined time period after the requested data transfer from the last column command.

If these two command sequences (row and column) are transferred from the host to the memory bus through separate FIFOs, the host has no control over when each command sequence reaches the memory side of its respective FIFO, no visibility into when each command is being executed, and no visibility into when it is time to execute the next command on the memory bus. This makes it difficult to control the timing relationships from the host side. By the same token, the memory side domain has no visibility into which devices might be requesting memory access or what the order of command sequences might be until the various commands are actually received at the output of the FIFOs. This makes it difficult for the memory side to take part in any scheduling effort. This disconnect between the host and memory clock domains makes it more difficult to control the proper order of execution and the required inter-command timing delays. Using conventional approaches, providing handshaking signals between the two domains introduces excessive circuit complexity, while inserting worst-case timing delays seriously degrades performance.

BRIEF DESCRIPTION OF THE DRAWINGS

FIG. 4 shows a state diagram for controlling the timing and cue information used in the invention.

DETAILED DESCRIPTION OF THE INVENTION

Figure 1:
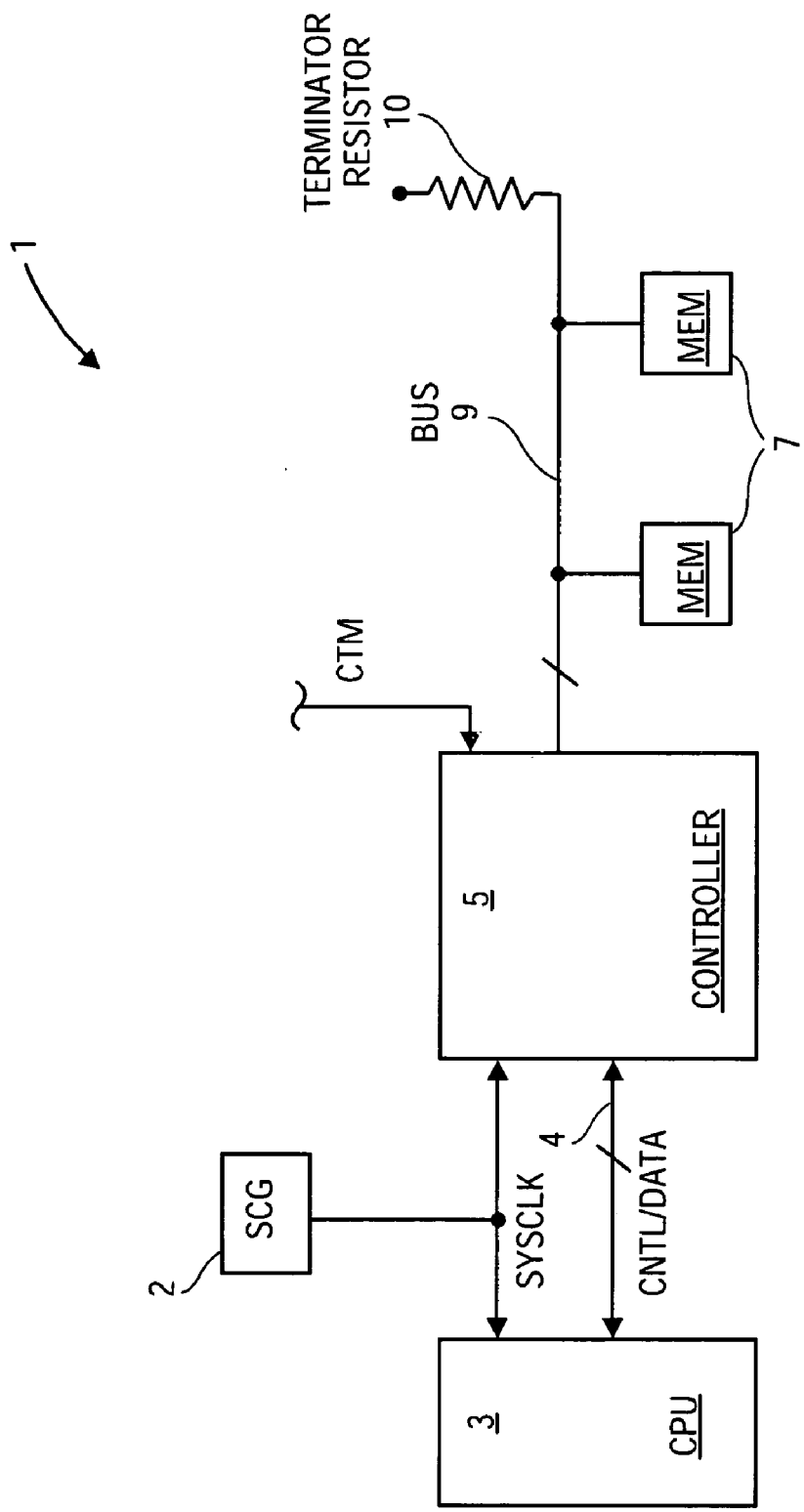
FIG. 1 shows a block diagram of a system of the invention.

By way of illustration, FIG. 1 shows a block diagram of a system 1 including a Rambus™ dynamic random access memory (RDRAM) controller. Memory controller 5 includes interface logic for passing control and data signals between CPU 3 (and/or other devices making memory requests) and one or more memory devices (MEM) 7 on memory bus 9. On the host (CPU) side of controller 5, the system clock SYSCLK is provided by system clock generator (SCG) 2, which provides SYSCLK to both CPU 3 and the host side of controller 5. SYSCLK, or derivatives thereof, are used to clock the control and data signals on bus 4, and to clock the interface logic to bus 4 within controller 5. On the memory side of controller 5, the clock-to-master (CTM) clock signal, or derivatives thereof, are used to clock the control and data signals on memory bus 9, and to clock the interface logic to bus 9 within controller 5. Terminator resistors 10 can be used to terminate each line in bus 9 to maintain proper impedance and reflectivity characteristics. SYSCLK and CTM represent the two clock signals for the two clock domains on the host and memory sides of the controller, respectively. SYSCLK and CTM typically have different frequencies.

Figure 2:
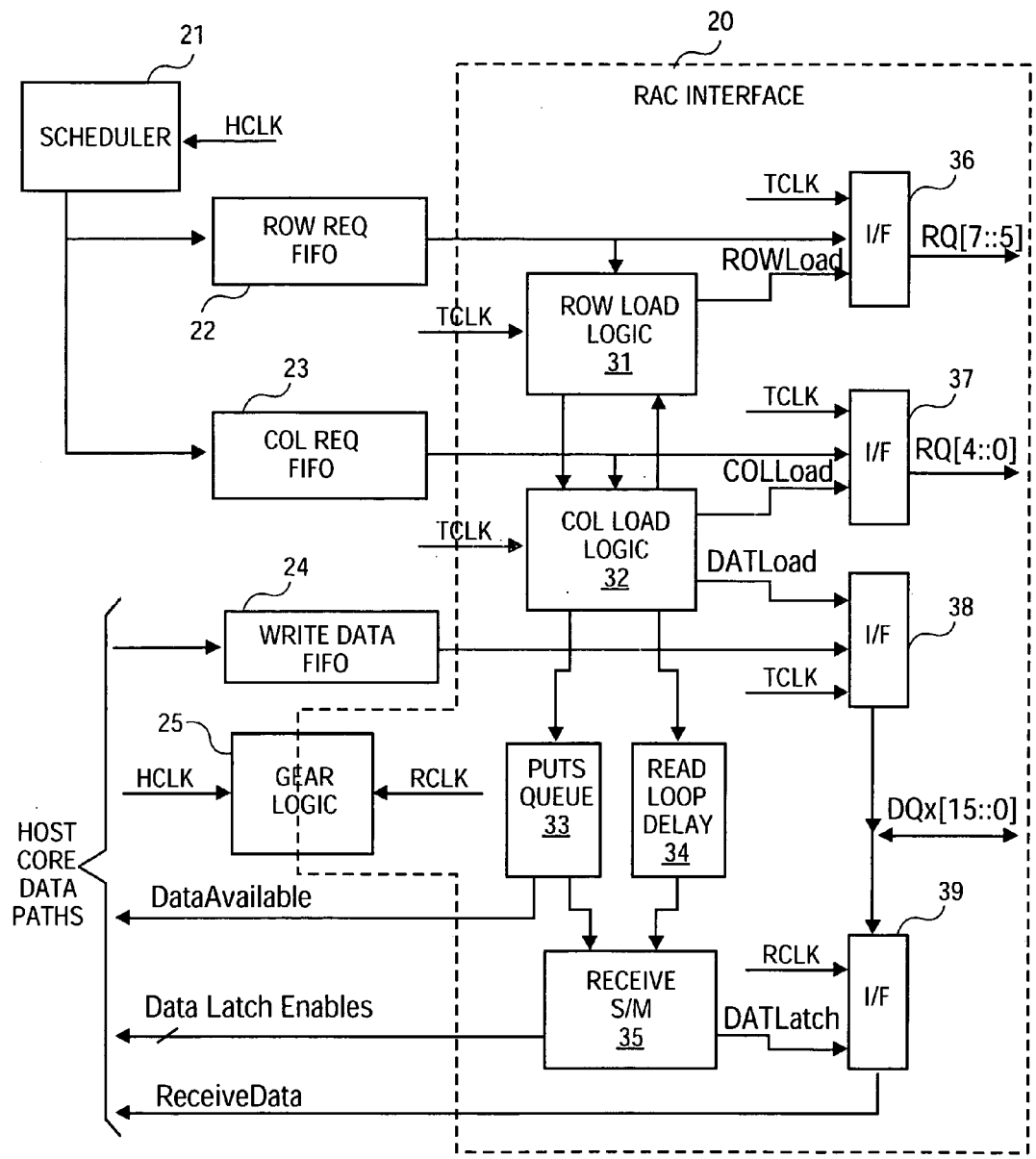
FIG. 2 shows a block diagram of memory controller including the invention.

FIG. 2 shows a more detailed view of some of the internal components of controller 5. RDRAM ASIC Controller (RAC) 20 can be a subcomponent of controller 5 and contains interface logic from controller 5 to memory bus 9. Bus 9 is actually composed of two relatively independent buses—a control bus and a data bus. In the embodiment shown, the control bus includes eight unidirectional request lines RQ7–RQ0 while the data bus includes sixteen bi-directional data lines DQ15–DQ0. The illustrated embodiment of RAC 20 operates in burst mode. Each time a memory transfer is set up by a command sequence, the contents of a predetermined number of sequential memory addresses are transferred, beginning with the memory address specified by the command. For example, a command sequence would begin by placing a specified row number on command lines RQ7–5. This causes the specified row (block) of memory to be opened. The block might be a page of memory, or some other size block. Once the row is opened, a specified column number is placed on command lines RQ4–0. This causes the specified column (sub-block) within the opened block to be selected. One of the column bits can be used to specify a read or a write. The column command also initiates the transfer of data from the specified sub-block. These commands typically require more bits than the number of lines allocated for their transfer, so a sequence of several transfers over RQ7–5 or RQ4–0 would be used to transfer the entire command.

The terms "row" and "column" are frequently used in describing a memory selection process because the memory devices are conceptually (and sometimes physically) laid out in a row/column format. However, this particular layout is not a requirement for the practice of the invention.

Once a transfer is initiated by the column command, the selected memory device begins transferring data over data lines DQ15–0, either from memory for a read command, or to memory for a write command. The number of bytes that are transferred in parallel at the same time depends on the width of the data bus. In this example, with a data bus width of sixteen data lines (DQ15–0), it would be two bytes at a time over the sixteen data lines. The number of sequential transfers to be made in response to the single column command can be predetermined. The system might be set up to consistently transfer the same number of bytes each time, or the number of bytes to transfer might be specified during the command sequence, using available command bits for that purpose.

Once a transfer has been initiated by a column command, another transfer can be initiated by a subsequent column command. As long as this data is located within the same row or block of memory, there is no need to issue another row command because the selected memory block is already open. If another block is to be chosen, then another row command must be issued before the column command so that the memory transfer will be from the proper memory block.

RDRAM memory systems are designed to transfer data in a burst mode at high data rates, and minimizing overall transfer time is important. For this reason, the command bus is typically decoupled from the data bus so that the command bus can be setting up one or more subsequent data transfers before the data bus has completed (or even begun) a data transfer from a previous command.

As previously stated, RAC 20 operates between two different time domains. On the host side, host clock HCLK is used for timing and data transfers. HCLK is typically derived from SYSCLK, which is the controlling clock signal for host-side timing. On the memory side, read clock RCLK and transmit clock TCLK are used for timing and data transfers over memory bus 9. RCLK and TCLK are derived from clock signal CTM, which is the controlling clock signal for memory-side timing. To assure proper timing relationships between the various signals, RCLK can be a slightly delayed version of CTM, while TCLK can be advanced 90 degrees or more from RCLK. TCLK is used to clock row requests, column requests, and write data from interface logic circuits 36, 37 and 38, respectively, onto memory bus 9. RCLK is used to clock read data from memory bus 9 into interface logic circuit 39. CTM feeds directly through controller 5 to one of the lines in bus 9 as a Clock-from-Master (CFM) clock signal (not shown). CFM is used to time data and command write transfers on bus 9, while CTM is used to time data read transfers.

Although the host-side and memory-side clocks have different frequencies and can be derived from independent sources, the efficiency of the transfer from one time domain to the other is improved if the two clocks can be synchronized. This function can be performed by gear logic 25. The frequencies of HCLK and RCLK are chosen so that the ratio of the two frequencies is a ratio of two small integers x and y. For example, if HCLK is 133 megahertz (MHz) and RCLK is 400 MHz, the ratio of x/y would be 1/3. Within this constraint, gear logic 25 can adjust the phase of one of the clocks so that the clocks are synchronized every x/y cycles. Using the 1/3 ratio as an example, on every cycle of HCLK and every third cycle of RCLK, the rising edges of HCLK and RCLK would coincide. This improves the efficiency of inter-domain transfers at the bit level.

Memory transfers can be requested from the host side of controller 5 not only by CPU 3, but by other devices (not shown) capable of accessing memory. Since multiple devices might try to access memory devices 7 at approximately the same time, scheduler 21 can be employed to receive, prioritize, schedule and issue these requests in an orderly, controlled manner. In FIG. 2, scheduler 21 is shown scheduling the command sequence by feeding the row and column commands into row request first-in first-out buffer (FIFO) 22 and column request FIFO 23. Write data for the write data FIFO 24 is shown as being provided by the requesting device. However, in another embodiment, scheduler 21 can also schedule the write data into write data FIFO 24.

As shown in FIG. 2, separate FIFOs are used for the Row Request commands, Column Request commands, and Write data. Due to the nature of the RDRAM memory bus operation, each FIFO may contain significantly different amounts of information associated with the same memory request. Row request FIFO 22 might contain a single request to open a row, while column request FIFO 23 might contain one or several column requests for accessing different areas of the row once it has been opened. Write data FIFO 24 can contain several data entries for each column request involving a memory write, or no data for a column request involving a memory read. The relationship between the number of entries in the row, column, and write data FIFOs is entirely unpredictable, so some sort of mechanism must be used to keep the associated row, column, and write data entries tied together.

In addition, various timing relationships should be maintained between the various commands. When a row request command is issued from interface logic 36 onto memory bus 9, the selected memory device 7 requires a minimum setup time to open the designated row before it can accept the first column request command from interface logic 37. However, for any subsequent column request commands within that same row, the row has already been opened and the setup time is either not required or is greatly reduced. By the same token, before a new row request can be issued, the memory must have time to complete the data transfer from the previously requested row and close that row. The required delays between execution of the various commands is therefore dependent on the order in which the commands are issued, an order known in advance only to scheduler 21 on the host side. The point at which a delay time has actually expired is determinable only on the memory side.

The invention is able to provide the required timing controls by placing interdependent functions on both the host and memory sides of the FIFOs. There are several ways in which the timing delays can be controlled and executed: 1) no-operation (NOP) commands, 2) programmable delays, 3) cues, and 4) pseudo commands. These are described below in more detail.

NOP Commands

For a given FIFO, scheduler 21 can issue a no-operation (NOP) command, which does not initiate any action but requires one full command time to complete, thereby delaying any subsequent action for a single command time. In one embodiment, a command time is four memory-side clock cycles. Placing a NOP between command A and command B in the same FIFO would therefore cause a delay of four clock cycles between the execution of command A and command B.

Programmable Delays

Scheduler 21 can insert a programmed delay of a specified number of clock cycles into a command. Specific bits in the command can be reserved for that purpose. When the command is ready for execution on the memory side, execution will be delayed by the number of memory-side clock cycles specified. This implies that scheduler 21 has knowledge of the timing relationships that exist in the memory-side domain, expressed in memory-side clock cycles.

Figure 3:
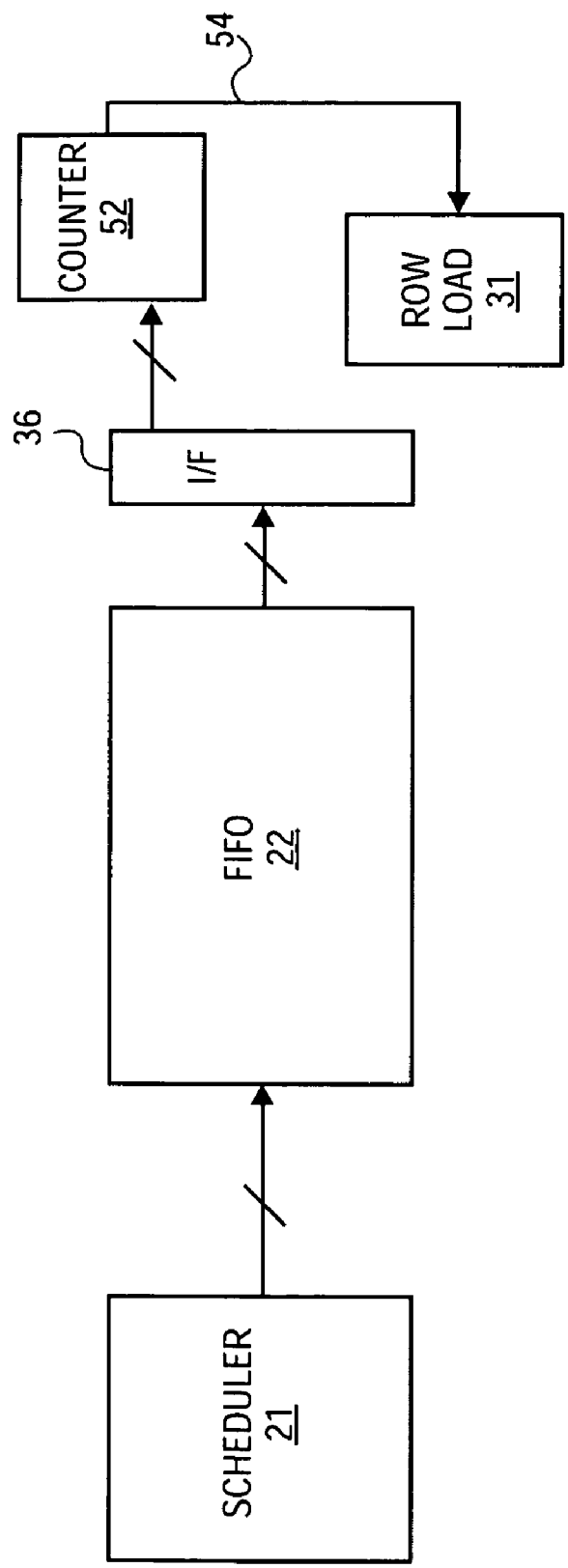
FIG. 3 shows a block diagram of a programmable delay circuit.

FIG. 3 shows how the timing data can be implemented, using row request FIFO 22 as an example. Scheduler 21 schedules a row request by placing a row request command and associated timing data into FIFO 22. For example, this timing data might be a binary 101, indicating a required delay of five clock cycles. When the command and timing information advance from the output of FIFO 22 to interface logic 36, the timing information can be used to set a counter 52 to a count of five. After five clock cycles, counter 52 counts down to zero and triggers a timeout signal on line 54. This timeout signal can then be used as an input to row load logic 31, which can be a state machine. Logic 31 can then use this input to initiate execution of the row command by transmitting the row command over memory bus 9.

If the range of time delays is greater than can be accommodated by the number of command bits reserved for this purpose, the timing bits from the command can be used to index a table of timing delays, and the selected delay placed into counter 52.

By placing the relevant timing data into the FIFO along with its associated command, the required delays associated with each command can be dynamically altered without excessive additional logic. Scheduler 21 already determines which commands and data will be scheduled and in which order, and has knowledge of the required timing relationships. Thus scheduler 21 can be used to insert these timing relationships into the FIFO along with the associated commands, without significantly increasing the complexity of the scheduler, the FIFOs, or the circuitry following the FIFOs.

Cues

Scheduler 21 can also insert timing cues into the commands, such as 'wait' cues and 'go-ahead' cues. If a command contains a wait cue, it will not execute until it receives a go-ahead signal from the memory side logic associated with another FIFO. If a command contains a go-ahead cue, upon execution it will initiate that go-ahead signal to the other FIFO. For example, by placing a wait cue in command A and a go-ahead cue in command B, command A will not execute before command B, even if command A reaches the output of one FIFO before command B reaches the output of another FIFO.

Pseudo Commands

Scheduler 21 can also place a pseudo command in a FIFO to initiate an action. A pseudo command causes some function such as power state changes to be performed by the logic, but is not placed on the bus to the memory modules.

The above four functions can be combined in various ways. For example, a programmable delay can be placed into a row command or a column command, but it can also be placed into a pseudo command to create a programmable delay that is not tied to a specific memory bus comand. A cue can likewise be placed into a memory bus command, a pseudo command, or a NOP.

Referring back to FIG. 2, row load logic 31 and column load logic 32 can be used to control the flow of signals and information between the request FIFOs 22,23 and the associated interface logic 36, 37. In one embodiment, logic circuits 31 and 32 are implemented as one or more state machines.

FIG. 4 shows a state diagram implementing some of the functions that can be performed when logic circuits 31 and/or 32 are implemented as state machines. Step 508 represents an idle state at which the state machine resides when the FIFO is empty. A reset function can also direct the state machine to this state as a startup condition. When the scheduler writes a command into the FIFO, execution goes to step 501, where the command is fetched from the FIFO output. If no timing delay has been indicated, execution goes directly to step 503. If a timing delay is indicated, execution goes to step 502. The timing data is loaded into counter 52, either by the state machine or through external circuitry. External to the state machine, counter 52 begins counting down, clocked by the memory-side clock. The state machine idles at step 502 until the counter times out, indicating the programmed delay has expired, and then goes to step 503. At step 503, the command is placed on the memory bus lines RQxx. In one embodiment, the command contains more bits than can be placed on the memory bus at one time, so it takes multiple clock cycles to complete the command transfer. Delay steps 504 and 505 can be used to wait for these multiple clock cycles before returning to step 501 to fetch the next command. If there is no next command, i.e., if the FIFO is empty, then execution will go to step 508 and idle rather than going to step 501 to fetch the next command.

If the command at step 501 contains a wait cue, the state machine branches to step 506. While the current command is being held in a wait state, the subsequent command is pre-fetched from the FIFO so that it will be immediately available when its time comes. In the meantime, the state machine idles at step 507 until a go-ahead signal is received in response to a go-ahead cue from another FIFO. When the go-ahead signal is received, the flow branches to step 503 for command execution if the current instruction does not contain a programmed delay. If it does contain a programmed delay, flow branches to step 502, where it waits for counter 52 to count down as previously described.

State machines for the row and column load logic can both follow the same flow just described, each being interactively connected to provide the other with a go-ahead cue signal.

In another embodiment, NOPs, programmable delays, and pseudo commands can be placed into a single FIFO, and the respective timing relationships used to control the timing of the execution of the commands as they exit that single FIFO.

When a memory read command is executed by placing it on memory bus 9, relevant information on the requested data transfer can be placed into puts queue 33 and read loop delay 34. These circuits, along with receive state machine 35, control the timing relationships for the data as it is being transferred from memory, through RAC 20, and to the requesting devices.

The invention can be implemented in circuitry or as a method. The invention can also be implemented as instructions stored on a machine-readable medium, which can be read and executed by at least one processor to perform the functions described herein. A machine-readable medium includes any mechanism for storing or transmitting information in a form readable by a machine (e.g., a computer). For example, a machine-readable medium can include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

The foregoing description is intended to be illustrative and not limiting. Variations will occur to those of skill in the art. Those variations are intended to be included in the invention, which is limited only by the spirit and scope of the appended claims.

What is claimed is:

1. An apparatus, comprising:
    a buffer having a buffer input and a buffer output;
    a scheduler coupled to the buffer input to place a first command and a second command into the buffer; and
    control logic coupled to the buffer output to control execution of the first and second commands;
    wherein the second command includes timing data defining a timing relationship between the execution of the first command and the execution of the second command;
    wherein the buffer includes a first FIFO having a first input and a first output and further includes a second FIFO having a second input and a second output; the scheduler is coupled to the first input to place the first command into the first FIFO and coupled to the second input to place the second command into the second FIFO; and the control logic includes first logic coupled to the first output to control execution of the first command and includes second logic coupled to the first logic and coupled to the second output to control execution of the second command.

2. The apparatus of claim 1, wherein the timing data indicates a programmable time period to be inserted between the execution of the first command and the execution of the second command.

3. The apparatus of claim 1, wherein the second command is a no-operation command.

4. The apparatus of claim 1, wherein at least one of the first and second commands is a pseudo command.

5. The apparatus of claim 1, wherein the timing data includes a cue.

6. The apparatus of claim 5, wherein the cue is a wait cue to cause the second command to wait for a go-ahead signal before executing.

7. The apparatus of claim 5, wherein the cue is a go-ahead cue to cause a go-ahead signal to be sent to the first logic to initiate execution of the first command.

8. The apparatus of claim 1, wherein at least one of the first logic and second logic is a state machine.

9. A computer system comprising:
    a processor;
    a memory bus coupled to at least one memory device;
    a memory controller coupled between the processor and the memory bus, the memory controller including:
    a buffer having a buffer input and a buffer output;
    a scheduler coupled to the buffer input to place a first command and a second command into the buffer; and
    control logic coupled to the buffer output to control execution of the first and second commands;
    wherein the second command includes timing data defining a timing relationship between the execution of the first command and the execution of the second command;
    wherein the buffer includes a, first FIFO having a first input and a first output and further includes a second FIFO having a second input and a second output; the scheduler is coupled to the first input to place the first command into the first FIFO and coupled to the second input to place the second command into the second FIFO; and the control logic includes first logic coupled to the first output to control execution of the first command and includes second logic coupled to the first logic and coupled to the second output to control execution of the second command.

10. The system of claim 9, wherein the timing data indicates a programmable time period to be inserted between the execution of the first command and the execution of the second command.

11. The system of claim 9, wherein the second command is a no-operation command.

12. The system of claim 9, wherein at least one of the first and second commands is a pseudo command.

13. The system of claim 9, wherein the timing data includes a cue.

14. The system of claim 13, wherein the cue is a wait cue to cause the second command to wait for a go-ahead signal before executing.

15. The system of claim 13, wherein the cue is a go-ahead cue to cause a go-ahead signal to be sent to the first logic to initiate execution of the first command.

16. The system of claim 9, further comprising a table of timing delays, wherein the timing data is to index the table of timing delays.

17. A method, comprising:
    placing a first command into a first FIFO;
    placing a second command having timing data into a second FIFO;
    executing the first command;
    waiting for a delay period indicated by the timing data; and
    executing the second command after the delay period.

18. The method of claim 17, wherein the timing data indicates a programmable delay period.

19. The method of claim 17, wherein the timing data indicates a programmable number of clock cycles to delay.

20. The method of claim 17, wherein the timing data is one of a wait cue and a go-ahead cue.

21. The method of claim 17, wherein at least one of the first and second commands is a pseudo command.

22. The method of claim 17, wherein at least one of the first and second commands is a no-operation command.

23. A machine-readable medium having stored thereon instructions, which when executed by at least one processor cause said at least one processor to perform:
    placing a first command into a first FIFO;
    placing a second command having timing data into a second FIFO;
    executing the first command;
    waiting for a delay period indicated by the timing data; and
    executing the second command after the delay period.

24. The medium of claim 23, wherein the timing data indicates a programmable delay period.

25. The medium of claim 23, wherein the timing data indicates a programmable number of clock cycles to delay.

26. The method of claim 23, wherein the timing data is one of a wait cue and a go-ahead cue.

27. The method of claim 23, wherein at least one of the first and second commands is a pseudo command.

28. The method of claim 23, wherein at least one of the first and second commands is a no-operation command.

* * * * *